US009312353B2

(12) United States Patent
Jeong et al.

(10) Patent No.: US 9,312,353 B2
(45) Date of Patent: Apr. 12, 2016

(54) DOUBLE GATE TYPE THIN FILM TRANSISTOR AND ORGANIC LIGHT EMITTING DIODE DISPLAY INCLUDING THE SAME

(71) Applicant: LG DISPLAY CO., LTD., Seoul (KR)

(72) Inventors: Woo-Cheol Jeong, Ulsan (KR); Sung-Jun Yun, Ansan-si (KR); Ju-Hee Son, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/097,743

(22) Filed: Dec. 5, 2013

(65) Prior Publication Data

US 2014/0159008 A1      Jun. 12, 2014

(30) Foreign Application Priority Data

Dec. 11, 2012   (KR) ................. 10-2012-0143606

(51) Int. Cl.
| | |
|---|---|
| H01L 27/14 | (2006.01) |
| H01L 29/423 | (2006.01) |
| H01L 29/49 | (2006.01) |
| H01L 29/786 | (2006.01) |
| H01L 27/32 | (2006.01) |

(52) U.S. Cl.
CPC ...... *H01L 29/42384* (2013.01); *H01L 29/4908* (2013.01); *H01L 29/7869* (2013.01); *H01L 29/78648* (2013.01); *H01L 27/3262* (2013.01)

(58) Field of Classification Search
CPC .............. H01L 29/78648; H01L 29/7869; H01L 27/3262; H01L 29/42384
USPC ........................................................ 257/72
See application file for complete search history.

(56) References Cited

U.S. PATENT DOCUMENTS

| 2009/0206332 A1* | 8/2009 | Son et al. ................. 257/43 |
| 2012/0007084 A1* | 1/2012 | Park et al. ................. 257/59 |
| 2012/0300151 A1* | 11/2012 | Yamazaki et al. ......... 349/43 |

FOREIGN PATENT DOCUMENTS

| CN | 1716632 A | 1/2006 |
| CN | 103165626 A | 6/2013 |
| EP | 2 086 013 A1 | 8/2009 |

OTHER PUBLICATIONS

Chiao-Shun Chuang et al., "P-13: Photosensitivity of Amorphous IGZO TFTs for Active-Matrix Flat-Panel Displays", SID 08 Digest, 2008, pp. 1215-1218.
Dae Hwan Kim et al., "Physical Model and Simulation Platform for High-Level Instability-Aware Design of Amorphous Oxide Semiconductor Thin-Film Transistors", SID 2012 Digest, 2012, pp. 11-14.
Office Action dated Sep. 30, 2015 for corresponding Chinese Patent Application No. 201310674628.5, 12 pages.

* cited by examiner

*Primary Examiner* — Ajay K Arora
(74) *Attorney, Agent, or Firm* — Brinks Gilson & Lione

(57) ABSTRACT

A double gate type thin film transistor includes a first electrode on a substrate; a gate insulating layer on the first gate electrode; a semiconductor layer on the gate insulating layer corresponding to the first gate electrode; an etch stop layer on the semiconductor layer; source and drain electrodes contacting both sides of the semiconductor layer, respectively, and spaced apart from each other on the etch stop layer; a passivation layer on the source and drain electrode; and a second gate electrode on the passivation layer and having a double-layered structure of a transparent electrode and an opaque electrode.

9 Claims, 3 Drawing Sheets

DOUBLE GATE TYPE THIN FILM TRANSISTOR AND ORGANIC LIGHT EMITTING DIODE DISPLAY INCLUDING THE SAME

The present invention claims the benefit of priority to Korean Patent Application No. 10-2012-0143606, filed in Korea on Dec. 11, 2012, which is hereby incorporated by reference for all purposes as if fully set forth herein.

BACKGROUND

1. Field of the Disclosure

The present disclosure relates to a double gate type thin film transistor, and more particularly, to a double gate type thin film transistor including a second gate electrode that is semi-transparent to prevent inflow of light into the transistor and an organic light emitting diode display device including the same.

2. Discussion of the Related Art

Recently, with the advent of an information-oriented society, the field of display devices configured to process and display a large amount of information has rapidly been developed. In particular, liquid crystal displays (LCDs) or organic light emitting diode (OLED) displays have lately been developed as flat panel displays (FPDs) having excellent performance, such as a small thickness, light weight, and low power consumption, and has superseded conventional cathode-ray tubes (CRTs).

Among the FPDs, the OLED display is widely used because it has advantages, such as light weight, thin profile, and low power consumption. The OLED display is used for various devices, such as laptop computer, monitor, and television.

Recently, as a driving or switching element for the display, an amorphous silicon thin film transistor (TFT) is usually used. However, as the display becomes large in size and requires high quality, an element having high performance is required. Accordingly, a TFT having high performance, such as high mobility, and a method of manufacturing the same is required.

Since a poly silicon TFT has high mobility, it can be applied to a display of high quality. However, complicated processes are required to form the poly silicon TFT, and production cost increases.

Accordingly, a new type TFT is required that has advantages of both the amorphous silicon TFT and the poly silicon TFT, and oxide TFTs are suggested.

There is a ZnO-based TFT among the oxide TFTs. Recently, as ZnO-based materials, Zn oxide material, GaInZn oxide material and etc. are provided. Since the ZnO-based TFT is able to be manufactured at low temperature and is in amorphous state, there is advantage that a large-sized display can be manufactured. Further, the ZnO-based TFT has high mobility and thus has an excellent electric property like the poly silicon TFT.

FIG. 1 is a cross-sectional view illustrating a bottom gate type TFT according to the related art.

Referring to FIG. 1, the TFT 1 includes a gate electrode 20 on a substrate 10, a gate insulating layer 30 on the gate electrode 20, an oxide semiconductor layer 40 on the gate insulating layer 30, and source and drain electrodes 60 and 70 on the oxide semiconductor layer 40.

The TFT 1 is a usual bottom type TFT, and in order to prevent light preventing flowing into the TFT, used is a method that prevents light from inflowing from a bottom side of the gate electrode 20 with the gate electrode increasing in size.

However, in this method, it is difficult to block inflow of light from a top side, aperture ratio is reduced, and a RC delay increases due to a parasitic capacitance between the source and drain electrodes and the gate electrode.

SUMMARY

A double gate type thin film transistor includes a first electrode on a substrate; a gate insulating layer on the first gate electrode; a semiconductor layer on the gate insulating layer corresponding to the first gate electrode; an etch stop layer on the semiconductor layer; source and drain electrodes contacting both sides of the semiconductor layer, respectively, and spaced apart from each other on the etch stop layer; a passivation layer on the source and drain electrode; and a second gate electrode on the passivation layer and having a double-layered structure of a transparent electrode and an opaque electrode.

In another aspect, an organic light emitting diode display includes a first electrode on a substrate; a gate insulating layer on the first gate electrode; a semiconductor layer on the gate insulating layer corresponding to the first gate electrode; an etch stop layer on the semiconductor layer; source and drain electrodes contacting both sides of the semiconductor layer, respectively, and spaced apart from each other on the etch stop layer; a passivation layer on the source and drain electrode; a second gate electrode on the passivation layer and having a double-layered structure of a transparent electrode and an opaque electrode; a first electrode on the passivation layer and connected to the drain electrode; a bank layer on the first electrode and having an opening exposing a portion the first electrode; a light emitting layer in the opening of the bank layer; and a second electrode on the light emitting layer.

In yet another aspect, a method of manufacturing a double gate type thin film transistor includes forming a first electrode on a substrate; forming a gate insulating layer on the first gate electrode; forming a semiconductor layer on the gate insulating layer corresponding to the first gate electrode; forming an etch stop layer on the semiconductor layer; forming source and drain electrodes contacting both sides of the semiconductor layer, respectively, and spaced apart from each other on the etch stop layer; forming a passivation layer on the source and drain electrode; and forming a second gate electrode on the passivation layer corresponding to the first gate electrode and having a double-layered structure of a transparent electrode and an opaque electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
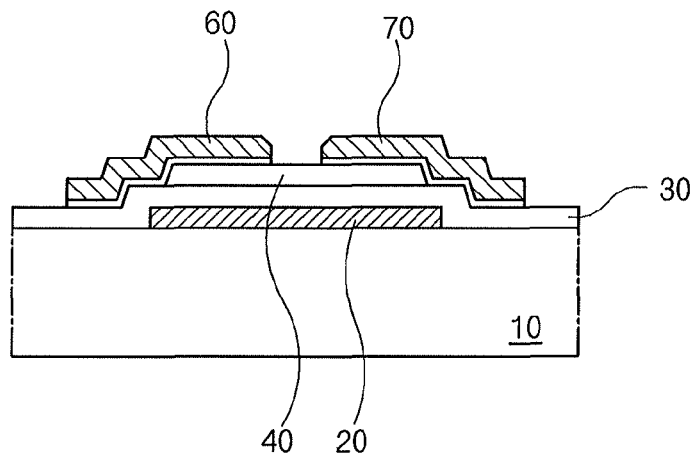
FIG. 1 is a cross-sectional view illustrating a bottom gate type TFT according to the related art.
Figure 2:
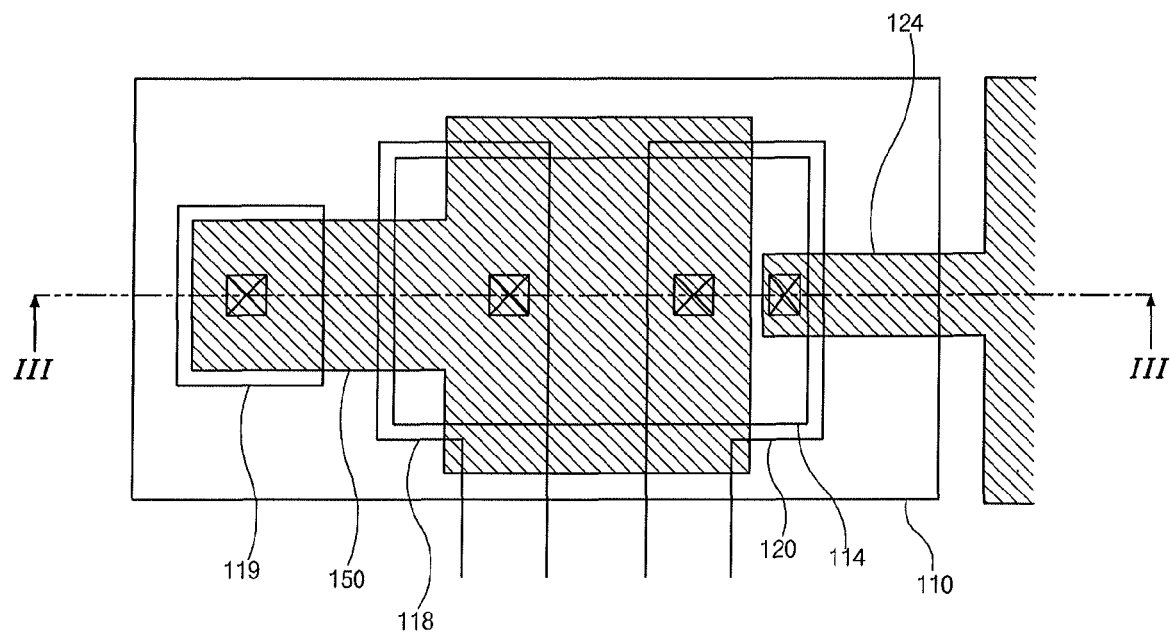
FIG. 2 is a plan view illustrating an OLED display including a double gate type TFT according to a first embodiment of the present invention.
Figure 3:
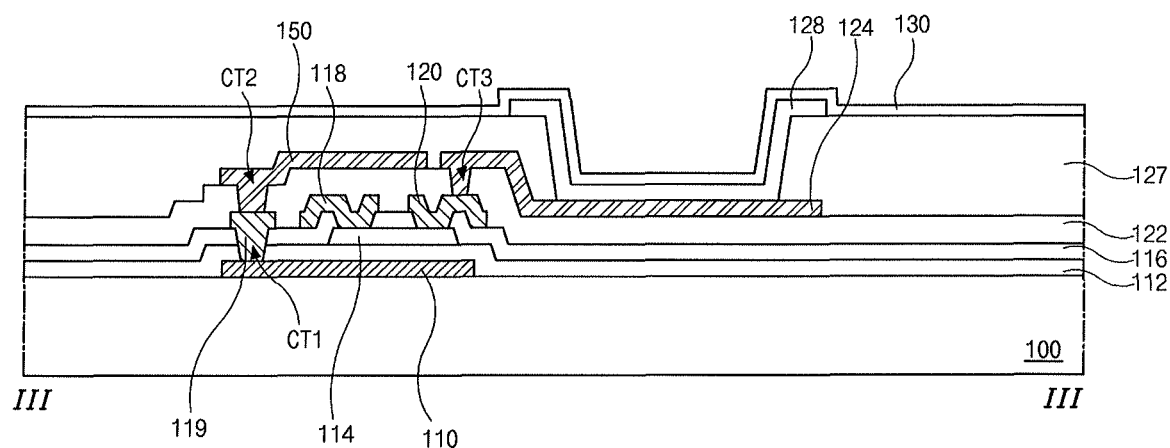
FIG. 3 is a cross-sectional view taken along a line of FIG. 2.

FIG. 2 is a plan view illustrating an OLED display including a double gate type TFT according to a first embodiment of the present invention, and FIG. 3 is a cross-sectional view taken along a line of FIG. 2.

Referring to FIGS. 2 and 3, the OLED display includes a double gate type TFT as a driving element, which includes a first gate electrode 110, a gate insulating layer 112, a semiconductor layer 114, an etch stop layer 116 and source and drain electrodes 118 and 120, a passivation layer 122, a second gate electrode 150, a first electrode 124, a bank layer 127, a light emitting layer 128 and a second electrode 130.

In more detail, the first gate electrode 110 is formed on a substrate 100, and the gate insulating layer 112 is formed on the first gate electrode 110. The substrate 100 may be a glass substrate, a transparent plastic substrate, or etc. The first gate electrode 110 may be made of, for example, ITO or ZnO. The first gate insulating material may be made of $SiO_2$ or SiNx.

The semiconductor layer 114 is formed at a predetermined thickness on the gate insulating layer 112 corresponding to the first gate electrode 110. The semiconductor layer 114 may be made of an oxide semiconductor material containing, for example, at least one of In, Ga and Zn.

The etch stop layer 116 is formed on the semiconductor layer 114. The etch stop layer 116 functions to prevent the semiconductor layer 114 from being damaged by a plasma, an etching solution or etching gas, in an etching process when the source and drain electrodes 118 and 120 is formed. Accordingly, the etch stop layer 116 is configured to cover the semiconductor layer 114, and particularly, a channel region of the semiconductor layer 114. That is, to prevent the channel region of the semiconductor layer 114, the etch stop layer 116 has an area equal to or greater than an area of the channel region such that it entirely covers the channel region of the semiconductor layer 114. The etch stop layer 116 may be made of an insulating material, for example, $SiO_2$. At least portion of the etch stop layer 116 may be exposed between the source and drain electrodes 118 and 120.

The source and drain electrodes 118 and 120 are formed on the etch stop layer 116. The source and drain electrodes 118 and 120 contact both sides of the semiconductor layer 114, respectively, and are spaced apart from each other on the etch stop layer 116.

The passivation layer 122 is formed on the source and drain electrodes 118 and 120. The passivation layer 122 may be made of the same material as the gate insulating layer 112, such as $SiO_2$ or SiNx.

The second gate electrode 150 is formed on the passivation layer 122 corresponding to the semiconductor layer 114, and is connected to the first gate electrode 110. The second gate electrode 150 may be made of an opaque material, for example, a metal such as MoTi, Cu, Al, Mo or Ti, or an alloy of the metals.

In the OLED display, the double gate type TFT includes a connection electrode 119 connecting the first gate electrode 110 and the second gate electrode 150. The connection electrode 119 connects the first gate electrode 110 and the second gate electrode 150 through a first contact hole CT1 formed in the gate insulating layer 112 and the etch stop layer 116, and a second contact hole CT2 formed in the passivation layer 122. The connection electrode 119 may be made of a transparent conductive material.

The first electrode 124 is formed on the passivation layer 122, and is connected to the drain electrode 120 through a drain contact hole CT3. The first electrode 124 may be made of an opaque material, for example, a metal such as MoTi, Cu, Al, Mo or Ti, or an alloy of the metals.

The bank layer 127 is formed on the first electrode 124, and has an opening exposing a portion of the first electrode 124. The light emitting layer 128 is formed in the opening of the bank layer 127. The light emitting layer may be made of a low molecular weight or high molecular weight organic material.

The second electrode 130 is formed on the light emitting layer 128. The second electrode 130 covers the opening of the bank layer 127 and may be formed entirely on the substrate 100.

Figure 4:
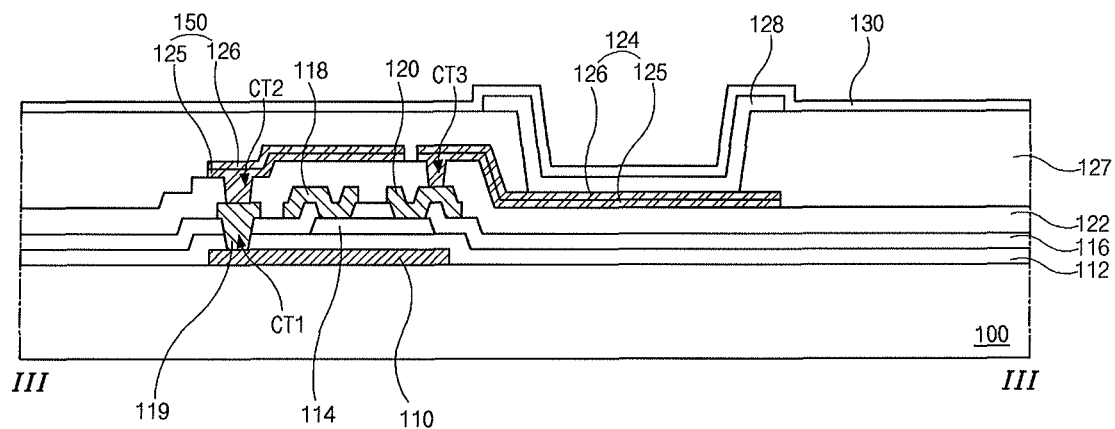
FIG. 4 is a cross-sectional view illustrating an OLED display according to a second embodiment of the present invention.

FIG. 4 is a cross-sectional view illustrating an OLED display according to a second embodiment of the present invention. The plan view of the second embodiment is substantially similar to FIG. 2 of the first embodiment. Explanations of parts similar to parts of the first embodiment may be omitted.

Referring to FIG. 4, the OLED display includes a double gate type TFT as a driving element, which includes a first gate electrode 110, a gate insulating layer 112, a semiconductor layer 114, an etch stop layer 116 and source and drain electrodes 118 and 120, a passivation layer 122, a second gate electrode 150, a first electrode 124, a bank layer 127, a light emitting layer 128 and a second electrode 130.

In more detail, the first gate electrode 110 is formed on a substrate 100, and the gate insulating layer 112 is formed on the first gate electrode 110. The substrate 100 may be a glass substrate, a transparent plastic substrate, or etc. The first gate electrode 110 may be made of, for example, ITO or ZnO. The first gate insulating material may be made of $SiO_2$ or SiNx.

The semiconductor layer 114 is formed at a predetermined thickness on the gate insulating layer 112 corresponding to the first gate electrode 110. The semiconductor layer 114 may be made of an oxide semiconductor material containing, for example, at least one of In, Ga and Zn.

The etch stop layer 116 is formed on the semiconductor layer 114. The etch stop layer 116 functions to prevent the semiconductor layer 114 from being damaged by a plasma, an etching solution or etching gas, in an etching process when the source and drain electrodes 118 and 120 is formed. Accordingly, the etch stop layer 116 is configured to cover the semiconductor layer 114, and particularly, a channel region of the semiconductor layer 114. That is, to prevent the channel region of the semiconductor layer 114, the etch stop layer 116 has an area equal to or greater than an area of the channel region such that it entirely covers the channel region of the semiconductor layer 114. The etch stop layer 116 may be made of an insulating material, for example, $SiO_2$. At least portion of the etch stop layer 116 may be exposed between the source and drain electrodes 118 and 120.

The source and drain electrodes 118 and 120 are formed on the etch stop layer 116. The source and drain electrodes 118 and 120 contact both sides of the semiconductor layer 114, respectively, and are spaced apart from each other on the etch stop layer 116.

The passivation layer 122 is formed on the source and drain electrodes 118 and 120. The passivation layer 122 may be made of the same material as the gate insulating layer 112, such as $SiO_2$ or SiNx.

The second gate electrode 150 is formed on the passivation layer 122 corresponding to the semiconductor layer 114, and is connected to the first gate electrode 110. The second gate electrode 150 may have an semi-transparent double-layered structure that include a transparent electrode 125 made of a transparent conductive material, and an opaque electrode 126 made of a metal such as MoTi, Cu, Al, Mo or Ti, or an alloy of the metals. That is, since the opaque electrode 126 is formed at a very small thickness, for example, several micrometers, the second gate electrode 150 of the double-layered structure can has a semi-transparent property.

In the OLED display, the double gate type TFT includes a connection electrode 119 connecting the first gate electrode 110 and the second gate electrode 150. The connection electrode 119 connects the first gate electrode 110 and the second gate electrode 150 through a first contact hole CT1 formed in the gate insulating layer 112 and the etch stop layer 116, and a second contact hole CT2 formed in the passivation layer 122. The connection electrode 119 may be made of a transparent conductive material.

The first electrode 124 is formed on the passivation layer 122, and is connected to the drain electrode 120. The first electrode 124 may have an semi-transparent double-layered structure, similar to the second gate electrode 150, that include a transparent electrode 125 made of a transparent conductive material, and an opaque electrode 126 made of a metal such as MoTi, Cu, Al, Mo or Ti, or an alloy of the metals.

The bank layer 127 is formed on the first electrode 124, and has an opening exposing a portion of the first electrode 124. The light emitting layer 128 is formed in the opening of the bank layer 127. The light emitting layer may be made of a low molecular weight or high molecular weight organic material.

The second electrode 130 is formed on the light emitting layer 128. The second electrode 130 covers the opening of the bank layer 127 and may be formed entirely on the substrate 100.

Figure 5:
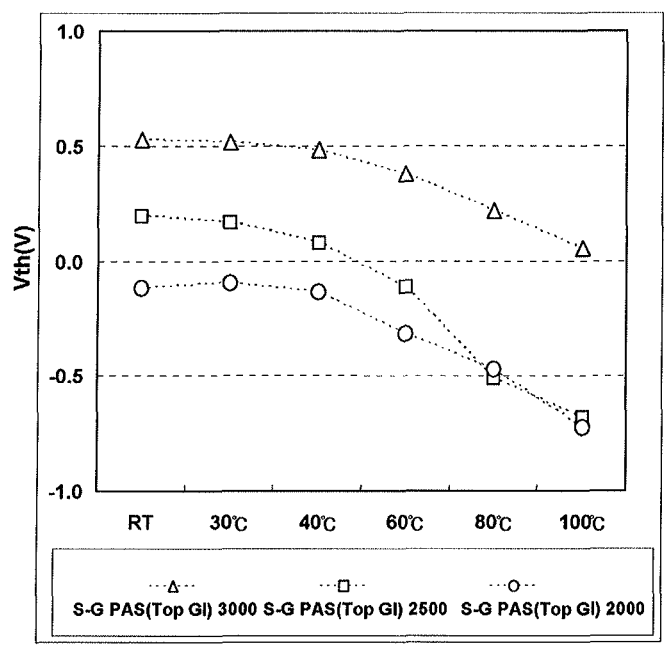
FIGS. 5 and 6 are graphs illustrating electric properties of the related art single gate type TFT and the double gate type according to the embodiment of the present invention, respectively.
Figure 6:
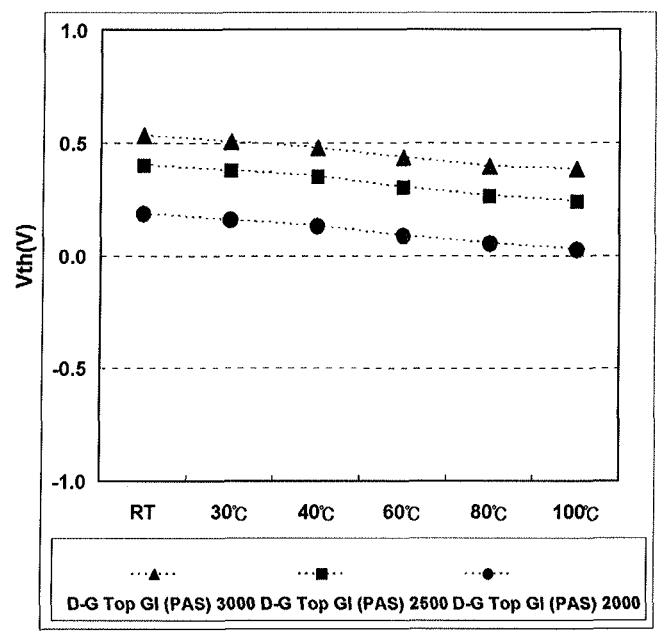

FIGS. 5 and 6 are graphs illustrating electric properties of the related art single gate type TFT and the double gate type according to the embodiment of the present invention, respectively. In other words, FIGS. 5 and 6 show shift of threshold voltage to increase of temperature in the TFTs.

Referring to FIGS. 5 and 6, it is shown that the shift of threshold voltage Vth of the embodiment is much less than that of the related art.

As described above, the double gate type TFT includes the semi-transparent second gate electrode. Accordingly, light can be prevented from inflowing into the TFT, and electrical property and reliability of the TFT can be improved.

The TFT of the embodiment may be employed into other display, for example, a liquid crystal display (LCD).

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A double gate type thin film transistor comprising:
a first gate electrode on a substrate;
a gate insulating layer on the first gate electrode;
a semiconductor layer on the gate insulating layer corresponding to the first gate electrode;
an etch stop layer on the semiconductor layer;
source and drain electrodes contacting both sides of the semiconductor layer, respectively, and spaced apart from each other on the etch stop layer;
a passivation layer on the source and drain electrode; and
a second gate electrode on the passivation layer and having a double-layered structure of a transparent electrode and an opaque electrode,
wherein the first gate electrode is electrically connected to the second gate electrode.

2. The transistor according to claim 1, further comprising a connection electrode connecting the first gate electrode and the second gate electrode, wherein the second gate electrode is connected to the connection electrode through a contact hole.

3. The transistor according to claim 1, wherein the second gate electrode is semi-transparent by the transparent electrode made of one of ITO or ZnO, and the opaque electrode made of at least one of MoTi, Cu, Al, Mo or Ti.

4. The transistor according to claim 1, wherein the semiconductor layer is made of an oxide semiconductor material including at least one of In, Ga or Zn, and the first gate electrode is made of ITO or ZnO.

5. An organic light emitting diode display comprising:
a first gate electrode on a substrate;
a gate insulating layer on the first gate electrode;
a semiconductor layer on the gate insulating layer corresponding to the first gate electrode;
an etch stop layer on the semiconductor layer;
source and drain electrodes contacting both sides of the semiconductor layer, respectively, and spaced apart from each other on the etch stop layer;
a passivation layer on the source and drain electrode;
a second gate electrode on the passivation layer and having a double-layered structure of a transparent electrode and an opaque electrode;
a first electrode on the passivation layer and connected to the drain electrode;
a bank layer on the first electrode and having an opening exposing a portion the first electrode;
a light emitting layer in the opening of the bank layer; and
a second electrode on the light emitting layer, wherein the second electrode is different from the second gate electrode.

6. A method of manufacturing a double gate type thin film transistor, the method comprising:
forming a first gate electrode on a substrate;
forming a gate insulating layer on the first gate electrode;
forming a semiconductor layer on the gate insulating layer corresponding to the first gate electrode;
forming an etch stop layer on the semiconductor layer;
forming source and drain electrodes contacting both sides of the semiconductor layer, respectively, and spaced apart from each other on the etch stop layer;
forming a passivation layer on the source and drain electrode; and
forming a second gate electrode on the passivation layer corresponding to the first gate electrode and having a double-layered structure of a transparent electrode and an opaque electrode, wherein the first gate electrode is electrically connected to the second gate electrode.

7. The method according to claim 6, further comprising forming a connection electrode connecting the first gate electrode and the second gate electrode, wherein the second gate electrode is connected to the connection electrode through a contact hole.

8. The method according to claim 6, wherein the second gate electrode is semi-transparent by the transparent electrode made of one of ITO or ZnO, and the opaque electrode made of at least one of MoTi, Cu, Al, Mo or Ti.

9. The method according to claim 6, wherein the semiconductor layer is made of an oxide semiconductor material including at least one of In, Ga or Zn, and the first gate electrode is made of ITO or ZnO.

* * * * *